(12) United States Patent
Lindahl et al.

(10) Patent No.: US 11,365,477 B2
(45) Date of Patent: Jun. 21, 2022

(54) COATED CUTTING TOOL

(71) Applicant: SANDVIK INTELLECTUAL PROPERTY AB, Sandviken (SE)

(72) Inventors: Erik Lindahl, Knivsta (SE); Jan Engqvist, Uppsala (SE)

(73) Assignee: Sandvik Intellectual Property AB, Sandviken (SE)

( * ) Notice: Subject to any disclaimer, the term of this patent is extended or adjusted under 35 U.S.C. 154(b) by 229 days.

(21) Appl. No.: 16/624,362

(22) PCT Filed: Jun. 19, 2018

(86) PCT No.: PCT/EP2018/066225
§ 371 (c)(1),
(2) Date: Dec. 19, 2019

(87) PCT Pub. No.: WO2018/234296
PCT Pub. Date: Dec. 27, 2018

(65) Prior Publication Data
US 2020/0115794 A1  Apr. 16, 2020

(30) Foreign Application Priority Data

Jun. 20, 2017  (EP) .................................. 17176904

(51) Int. Cl.
*C23C 16/30* (2006.01)
*C23C 16/32* (2006.01)
*C23C 16/34* (2006.01)
*C23C 16/40* (2006.01)
(Continued)

(52) U.S. Cl.
CPC .......... *C23C 16/403* (2013.01); *C23C 16/303* (2013.01); *C23C 16/32* (2013.01);
(Continued)

(58) Field of Classification Search
CPC ..... C23C 16/403; C23C 16/303; C23C 16/32; C23C 16/34; C23C 16/30; C23C 16/36;
(Continued)

(56) References Cited

U.S. PATENT DOCUMENTS

2015/0003925 A1* 1/2015 Ostlund .............. C23C 16/0272
407/119

FOREIGN PATENT DOCUMENTS

| EP | 0463000 B1 | 10/1994 |
|---|---|---|
| EP | 1245700 B1 | 9/2005 |
| RU | 1836233 A3 | 8/1993 |

OTHER PUBLICATIONS

Microstructure and performance of CVD kappa-Al2O3 multilayers, Halvarsson et al., Materials Science and Engineering A209, 1996, pp. 337-344 (Halvarsson) (Year: 1996).*

(Continued)

*Primary Examiner* — Daniel J. Schleis
*Assistant Examiner* — Kevin Ct Li
(74) *Attorney, Agent, or Firm* — Corinne R. Gorski

(57) ABSTRACT

A coated cutting tool includes a multilayer of alternating sublayers of $\kappa\text{-Al}_2\text{O}_3$ and sublayers of TiN, TiC, TiCN, TiCO or TiCNO. The multilayer includes at least 3 sublayers of $\kappa\text{-Al}_2\text{O}_3$. The multilayer further exhibits an XRD diffraction over a $\theta\text{-}2\theta$ scan of 15°-140°, wherein the 0 0 2 diffraction peak (peak area) is the strongest peak originating from the $\kappa\text{-Al}_2\text{O}_3$ sublayers of the multilayer.

14 Claims, 3 Drawing Sheets

(51) Int. Cl.
 *C23C 28/00* (2006.01)
 *B23C 5/00* (2006.01)
(52) U.S. Cl.
 CPC ............ *C23C 16/34* (2013.01); *C23C 28/341* (2013.01); *C23C 28/347* (2013.01); *C23C 28/42* (2013.01); *C23C 28/44* (2013.01); *B23C 5/006* (2013.01)
(58) Field of Classification Search
 CPC ..... C23C 28/341; C23C 28/347; C23C 28/42; C23C 28/44; C23C 28/044; C23C 30/005; B23C 5/006
 See application file for complete search history.

(56) References Cited

OTHER PUBLICATIONS

Microstructural Investigations of CVD TiN/ κ-Al2O¬3 Multilayer Coatings on Cemented Carbides, Vuorinen et al., Int. I. of Refractory Metals and Hard Materials 15, 1997, pp. 169-178 (Vuorinen). (Year: 1997).*
Halvarsson et al: :Microstructural investigations of CVD TiN/@K-Al"20"3 multilayer coatings on cemented carbides", International Journal of Refractory Metals and Hard Metals, Elsevier, Amsterdam, NL, vol. 15 No. 1-3, Jan. 1, 1997, pp. 169-178.
Halvarsson et al: "Microstructure and performance of CVD @k-Al "20"3 multilayers", Materials Science and Engineering: A, Elsevier, Amsterdam, NL, vol. 209, No. 1-2, May 1, 1996, pp. 337-344.

* cited by examiner

COATED CUTTING TOOL

RELATED APPLICATION DATA

This application is a § 371 National Stage Application of PCT International Application No. PCT/EP2018/066225 filed Jun. 19, 2018 claiming priority to EP 17176904.5 filed Jun. 20, 2017.

TECHNICAL FIELD OF THE INVENTION

The present invention relates to a coated metal cutting tool comprising a multilayer with sublayers of κ-alumina and sublayers of TiN, TiC, TiCN, TiCO or TiCNO.

BACKGROUND

In the metal cutting industry coated cutting tools are well known in the art. CVD coated cutting tools and PVD coated cutting tools are the two most dominating types. Advantages with coatings on cutting tools are effects such as improved resistance towards chemical and abrasive wear which are important to provide a long tool life.

CVD coatings comprising a layer of TiCN together with a subsequent layer of alumina are known to perform well. In some demanding operations it has shown advantageous to apply multilayered CVD coatings.

EP0463000B1 (Kennametal) discloses multilayer coated cemented carbide cutting insert wherein the multilayer comprises alumina sublayers and nitride sublayers. The alumina sublayer is <1.5 μm and the nitride sublayer is <1 μm. The cutting tool showed improved flank and crater wear resistance in turning in SS1672 steel.

EP1245700B1 (Seco) discloses a coated cutting tool provided with a 3-30 μm multilayer comprising sublayers of 0.1-3.2 μm κ-alumina and 0.3-1.2 μm Ti(C, N). The cutting tool showed improved flank and crater wear resistance in turning in SS1672 steel.

There is a continuous strive to provide cutting tools that perform better than the previous known cutting tools. The technical solutions differ depending on operation and work piece material. A cutting tool aimed for turning in high hardened steel is not optimized for milling in stainless steel.

SUMMARY OF THE INVENTION

One object of the present invention is to provide a coated cutting tool with an improved wear resistance compared to known cutting tools. It is a further object of the present invention to provide a cutting tool with improved properties in turning of hardened steel and unalloyed steel. A further object of the present invention is to provide a cutting tool with improved resistance to crater and flank wear in turning operations.

At least one of these objects is achieved with a cutting tool according to claim 1. Preferred embodiments are listed in the dependent claims.

The present invention is related to a coated cutting tool comprising a substrate and a coating, wherein the coating comprises a multilayer consisting of alternating sublayers of κ-$Al_2O_3$ and sublayers of TiN, TiC, TiCN, TiCO or TiCNO, said multilayer comprises at least 3 sublayers of κ-$Al_2O_3$. Said multilayer exhibits an XRD diffraction over a θ-2θ scan of 15°-140°, wherein the 0 0 2 diffraction peak (peak area) is the strongest peak originating from the κ-$Al_2O_3$ sublayers of the multilayer.

It has surprisingly been found that a high "0 0 I orientation", i.e. a high intensity in the reflection from the 0 0 I planes (wherein I=2, 4, 6, etc.) of the κ-$Al_2O_3$ sublayers, in a κ-$Al_2O_3$-multilayer provides very promising wear resistance in turning of hardened steel.

The abbreviation "cutting tool" is herein intended to denote a cutting insert for milling or turning or a drill or end mill. The cutting tool is suitable for metal cutting applications.

In one embodiment of the present invention the average thickness of each TiN, TiC, TiCN, TiCO or TiCNO sublayer is 10-500 nm, preferably 50-200 nm. If these sublayers are too thin there is a risk that the layers are not fully covering the layer below and this would reduce the properties of the multilayer. If on the other hand these layers are too thick the properties of the layer would be comparable to a single layer.

In one embodiment of the present invention the average thickness of each κ-$Al_2O_3$ sublayer is 30-900 nm, preferably 50-800 nm, more preferably 100-700 nm. If these sublayers are too thin there is a risk that the layers are not fully covering the layer below and this would reduce the properties of the multilayer. If on the other hand these layers are too thick the properties of the layer would be comparable to a single layer.

In one embodiment of the present invention the coating further comprise an α-$Al_2O_3$-layer located between the substrate and the multilayer. An α-$Al_2O_3$-layer located below the multilayer has shown advantageous in that it is a promising way of increasing the 0 0 I orientation of the subsequent multilayer.

In one embodiment of the present invention the thickness of said α-$Al_2O_3$-layer is 0.1-10 μm, preferably 0.1-5 μm, more preferably 0.1-3 μm, most preferably 0.3-2 μm. If said α-$Al_2O_3$-layer is too thin it will not provide any increase in the 0 0 I orientation of the subsequent κ-$Al_2O_3$-sublayers. If the α-$Al_2O_3$-layer is too thick such as above 10 μm the properties of the coating will be brittle.

In one embodiment of the present invention the coating further comprise a TiCN layer located between the substrate and the multilayer. In one embodiment of the present invention said TiCN layer is located between the substrate and the α-$Al_2O_3$-layer. The TiCN layer preferably comprise columnar grains. A TiCN layer is advantageous in that it contributes to the wear resistance of the cutting tool and it also contributes in that the orientation of the TiCN layer can develop during growth which is advantageous for the orientation of the subsequent layers.

In one embodiment of the present invention the thickness of said TiCN layer is 2-15 μm. If the TiCN layer is too thin the advantages with developing a high orientation is reduced. If the TiCN layer is too thick the coating will suffer from brittleness.

In one embodiment of the present invention the TiCN layer exhibits a texture coefficient TC(hkl), as measured by X-ray diffraction using CuKα radiation and θ-2θ scan, defined according to Harris formula where I(hkl) is the measured intensity (peak area) of the (hkl) reflection, $I_0$(hkl) is the standard intensity according to ICDD's PDF-card No. 42-1489, n is the number of reflections, reflections used in the calculation are (1 1 1), (2 0 0), (2 2 0), (3 1 1), (3 3 1), (4 2 0) and (4 2 2), wherein the TC (422)+TC(311)>3, preferably >4. Harris formula:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

where I(hkl) is the measured intensity (peak area) of the (hkl) reflection and $I_0$(hkl) is the standard intensity according to a PDF card.

In one embodiment of the present invention the thickness of said multilayer is 1-15 µm, preferably 1-10 µm, more preferably 1-5 µm. If the multilayer is thinner than 1 µm the wear resistance of the coated cutting tool will be less significant. If the multilayer on the other hand is too thick the coating will be brittle and the advantageous with a multilayer less pronounced.

In one embodiment of the present invention the total coating thickness is 2-9 µm and said κ-$Al_2O_3$-multilayer comprises 5-70 sublayers of κ-$Al_2O_3$. This embodiment is suitable to milling or drilling metal cutting applications.

In one embodiment of the present invention the total coating thickness is 7-25 µm and the κ-$Al_2O_3$-multilayer comprises 5-150 sublayers of κ-$Al_2O_3$. This embodiment is suitable to turning metal cutting applications.

In one embodiment of the present invention the multilayer consist of alternating sublayers of κ-$Al_2O_3$ and sublayers of TiN. The TiN sublayers are preferably (111) oriented resulting in a suitable match in inter-atomic distance to the subsequent (0 0 I) oriented κ-$Al_2O_3$-sublayer. This influences the orientation and the residual stresses of the sublayers.

In one embodiment of the present invention the substrate is of cemented carbide or of cermet. These substrates have hardnesses and a toughness that suit the coating of the present invention.

In one embodiment of the present invention the substrate of the coated cutting tool consists of cemented carbide comprising 4-12 wt % Co, preferably 6-8 wt % Co, optionally 0.1-10 wt % cubic carbides, nitrides or carbonitrides of metals from groups IVb, Vb and VIb of the periodic table, preferably Ti, Nb, Ta or combinations thereof, and balance WC.

Still other objects and features of the present invention will become apparent from the following detailed description considered in conjunction with the accompanying drawings.

METHOD

XRD Examination

Figure 1:
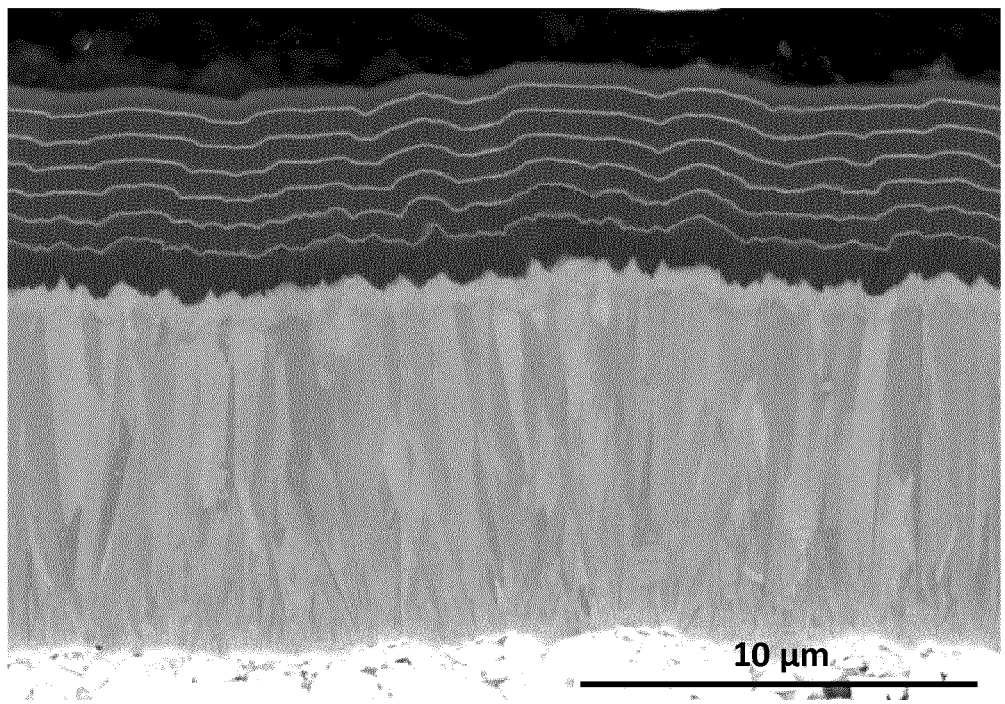
FIG. 1 shows a Scanning Electron Microscope (SEM) image of the coating according to sample A.
Figure 2:
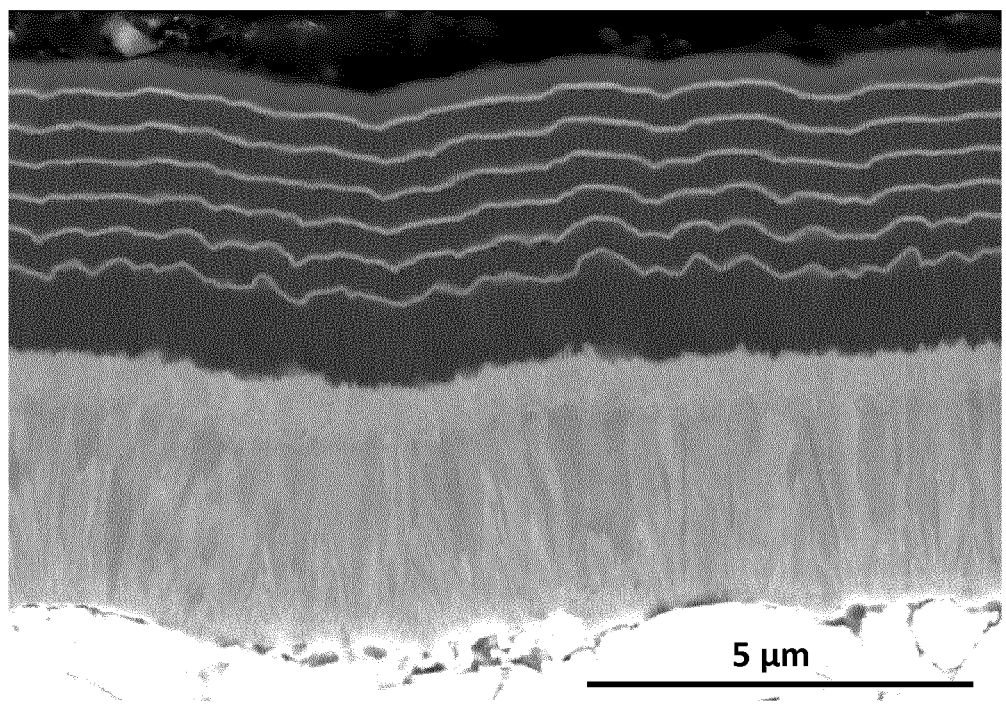
FIG. 2 shows a Scanning Electron Microscope (SEM) image of the coating according to sample B.

A common way to analyze the texture of a polycrystalline film is to calculate texture coefficients (TC) based on Harris formula and standard intensity PDF cards. The out of plane texture for κ-$Al_2O_3$-multilayer is however hard to determine from calculation of texture coefficients since the crystal structure of κ-$Al_2O_3$ has a low symmetry and therefore there are many peaks of low intensity in the diffractogram. Also there are a lot of overlapping peaks. Therefore, the peak of the highest intensity of the κ-$Al_2O_3$-multilayer is selected here as a measure of the texture of the layer.

In the analyse of the orientation of the κ-$Al_2O_3$ sublayers, the data should normally be thin film corrected to take into account the linear absorption in the sublayers. In ideal cases, the data should also be corrected for absorption in the TiN, TiC, TiCN, TiCO, TiCNO sublayers. However, the low thicknesses of the sublayers and the high number of sublayers make these corrections troublesome. Since the κ-$Al_2O_3$ sublayers of the present invention provides a very strong 0 0I orientation and since the influence of such corrections is limited, no such corrections are applied to the XRD data. The texture of the κ-$Al_2O_3$ sublayers of the present invention is set based on uncorrected data, i.e no compensation is made for the absorptions within the κ-$Al_2O_3$ sublayers of the multilayer or for absorptions within the TiN, TiC, TiCN, TiCO, TiCNO sublayers of the multilayer. The multilayer is in that sense handled as one single layer. The background scattering and overlapping peaks are however corrected for as well known by the skilled person.

In the analyse of the orientation of any layers below the multilayer, thin film correction is to be applied to the peak intensities, taken into account the linear absorption coefficient of layer. The absorptions in the multilayer can be generalized by summarizing the thicknesses of the sublayers of the same composition into single layers and make the calculations based on these thicknesses and their absorption.

Possible further layers above for example the multilayer will affect the X-ray intensities entering the multilayer and exiting the whole coating, and corrections need to be made for these, taken into account the linear absorption coefficient for the respective compound in a layer. Any further layers, such as TiN, above the multilayer can alternatively be removed by a method that does not substantially influence the XRD measurement results, e.g. chemical etching.

DETAILED DESCRIPTION OF THE INVENTION

The present invention is related to a coated cutting tool comprising a substrate and a coating, wherein the coating comprises a multilayer consisting of alternating sublayers of κ-$Al_2O_3$ and sublayers of TiN, TiC, TiCN, TiCO or TiCNO, said multilayer comprises at least 3 sublayers of κ-$Al_2O_3$. Said multilayer exhibits an XRD diffraction over a θ-2θ scan of 15°-140°, wherein the 0 0 2 diffraction peak (peak area) is the strongest peak originating from the κ-$Al_2O_3$ sublayers of the multilayer.

It has surprisingly been found that a high "0 0 I orientation", i.e. a high intensity in the reflection from the 0 0 I planes (wherein I=2, 4, 6, etc.) of the κ-$Al_2O_3$ sublayers, in a κ-$Al_2O_3$-multilayer provides very promising wear resistance in turning of hardened steel.

The abbreviation "cutting tool" is herein intended to denote a cutting insert for milling or turning or a drill or end mill. The cutting tool is suitable for metal cutting applications.

In one embodiment of the present invention the average thickness of each TiN, TiC, TiCN, TiCO or TiCNO sublayer is 10-500 nm, preferably 50-200 nm. If these sublayers are too thin there is a risk that the layers are not fully covering the layer below and this would reduce the properties of the multilayer. If on the other hand these layers are too thick the properties of the layer would be comparable to a single layer.

In one embodiment of the present invention the average thickness of each κ-$Al_2O_3$ sublayer is 30-900 nm, preferably 50-800 nm, more preferably 100-700 nm. If these sublayers are too thin there is a risk that the layers are not fully covering the layer below and this would reduce the properties of the multilayer. If on the other hand these layers are too thick the properties of the layer would be comparable to a single layer.

In one embodiment of the present invention the coating further comprise an $\alpha$-$Al_2O_3$-layer located between the substrate and the multilayer. An $\alpha$-$Al_2O_3$-layer located below the multilayer has shown advantageous in that it is a promising way of increasing the 0 0 I orientation of the subsequent multilayer.

In one embodiment of the present invention the thickness of said $\alpha$-$Al_2O_3$-layer is 0.1-10 µm, preferably 0.1-5 µm, more preferably 0.1-3 µm, most preferably 0.3-2 µm. If said $\alpha$-$Al_2O_3$-layer is too thin it will not provide any increase in the 0 0 I orientation of the subsequent $\kappa$-$Al_2O_3$-sublayers. If the $\alpha$-$Al_2O_3$-layer is too thick such as above 10 µm the properties of the coating will be brittle.

In one embodiment of the present invention the coating further comprise a TiCN layer located between the substrate and the multilayer. In one embodiment of the present invention said TiCN layer is located between the substrate and the $\alpha$-$Al_2O_3$-layer. The TiCN layer preferably comprise columnar grains. A TiCN layer is advantageous in that it contributes to the wear resistance of the cutting tool and it also contributes in that the orientation of the TiCN layer can develop during growth which is advantageous for the orientation of the subsequent layers.

In one embodiment of the present invention the thickness of said TiCN layer is 2-15 µm. If the TiCN layer is too thin the advantages with developing a high orientation is reduced. If the TiCN layer is too thick the coating will suffer from brittleness.

In one embodiment of the present invention the TiCN layer exhibits a texture coefficient TC(hkl), as measured by X-ray diffraction using CuK$\alpha$ radiation and $\theta$-$2\theta$ scan, defined according to Harris formula where I(hkl) is the measured intensity (peak area) of the (hkl) reflection, $i_0$(hkl) is the standard intensity according to ICDD's PDF-card No. 42-1489, n is the number of reflections, reflections used in the calculation are (1 1 1), (2 0 0), (2 2 0), (3 1 1), (3 3 1), (4 2 0) and (4 2 2), wherein the TC (422)+TC(311)>3, preferably >4.

In one embodiment of the present invention the thickness of said multilayer is 1-15 µm, preferably 1-10 µm, more preferably 1-5 µm. If the multilayer is thinner than 1 µm the wear resistance of the coated cutting tool will be less significant. If the multilayer on the other hand is too thick the coating will be brittle and the advantageous with a multilayer less pronounced.

In one embodiment of the present invention the total coating thickness is 2-9 µm and said $\kappa$-$Al_2O_3$-multilayer comprises 5-70 sublayers of $\kappa$-$Al_2O_3$. This embodiment is suitable to milling or drilling metal cutting applications.

In one embodiment of the present invention the total coating thickness is 7-25 µm and the $\kappa$-$Al_2O_3$-multilayer comprises 5-150 sublayers of $\kappa$-$Al_2O_3$. This embodiment is suitable to turning metal cutting applications.

In one embodiment of the present invention the multilayer consist of alternating sublayers of $\kappa$-$Al_2O_3$ and sublayers of TiN. The TiN sublayers are preferably (111) oriented resulting in a suitable match in inter-atomic distance to the subsequent (0 0 I) oriented $\kappa$-$Al_2O_3$-sublayer. This influences the orientation and the residual stresses of the sublayers.

In one embodiment of the present invention the substrate is of cemented carbide or of cermet. These substrates have hardnesses and a toughnesses that suit the coating of the present invention.

In one embodiment of the present invention the substrate of the coated cutting tool consists of cemented carbide comprising 4-12 wt % Co, preferably 6-8 wt % Co, optionally 0.1-10 wt % cubic carbides, nitrides or carbonitrides of metals from groups IVb, Vb and VIb of the periodic table, preferably Ti, Nb, Ta or combinations thereof, and balance WC.

In one embodiment of the present invention the substrate consists of cemented carbide with a binder phase enriched surface zone. The thickness of the binder phase enriched surface zone is preferably 5-35 µm as measured from the surface of the substrate and towards the core of the substrate. The binder phase enriched zone has in average a binder phase content at least 50% higher than the binder phase content in the core of the substrate. A binder phase enriched surface zone enhances the toughness of the substrate. A substrate with a high toughness is preferred in cutting operations such as turning of steel.

In one embodiment of the present invention the substrate consists of cemented carbide with a surface zone essentially free from cubic carbides. The thickness of the surface zone essentially free from cubic carbides is preferably 5-35 µm as measured from the surface of the substrate and towards the core of the substrate.

By "essentially free" means that no cubic carbides is visible in an ocular analyse of a cross section in a light optical microscope.

In one embodiment of the present invention the substrate consists of a cemented carbide with a binder phase enriched surface zone as disclosed above in combination with a surface zone essentially free from cubic carbides as disclosed above.

In one embodiment of the present invention a $\kappa$-$Al_2O_3$ layer is the outermost layer of the coating. Alternatively, one or more further layers can cover the multilayer, such as layers of TiN, TiC, $Al_2O_3$ and/or combinations thereof. In one embodiment of the present invention the one or more further layers covering the multilayer is/are removed from the flank face or the rake face or the cutting edge or combinations thereof.

In one embodiment of the present invention the coating is post treated by blasting or brushing to release tensile stresses of the CVD coated layers and to reduce the surface roughness.

In one embodiment of the present invention the coating comprises an $\alpha$-$Al_2O_3$-layer that is highly oriented with 00l planes parallel to the surface of the substrate. In one embodiment the $\alpha$-$Al_2O_3$-layer exhibits a texture coefficient TC(hkl), as measured by X-ray diffraction using CuK$\alpha$ radiation and $\theta$-$2\theta$ scan, defined according to Harris formula $$TC(hkl) = \frac{I(hkl)}{I_0(hkl)} \left[ \frac{1}{n} \sum_{n=1}^{n} \frac{I(hkl)}{I_0(hkl)} \right]^{-1}$$

where I(hkl) is the measured intensity (peak area) of the (hkl) reflection, $I_0$(hkl) is the standard intensity according to ICDD's PDF-card No. 00-010-0173, n is the number of reflections used in the calculation, and where the (hkl) reflections used are (1 0 4), (1 1 0), (1 1 3), (024), (1 1 6), (2 1 4), (3 0 0) and (0 0 12), wherein TC(0 0 12)≥2, preferably >4, more preferably >5.

EXAMPLES

Embodiments of the present invention will be disclosed in more detail in connection with the following examples. The examples are to be considered as illustrative and not limiting embodiments. In the following examples coated cutting tools (inserts) were manufactured, analyzed and evaluated in cutting tests.

Six types of coatings have been deposited in a radial Ionbond type CVD reactor 530 size capable of housing 10.000 half-inch size cutting inserts. Of the four types of samples Sample A and B are examples of the invention and Sample C and D are references. The samples were inserts with the ISO type geometry CNMG 120408-PM.

The composition of the substrates of Samples A-D are composed of 7.2 wt % Co, 2.9 wt % TaC, 0.5 wt % NbC, 1.9 wt % TiC, 0.4 wt % TiN and the rest WC.

The layer thicknesses were analyzed in a light optical microscope by studying a cross section of each coating at 1000× magnification. The layer thicknesses are presented in Table 1.

TABLE 1

Layer thicknesses

| Sample | TiN + TiCN + bonding layer [μm] | α-$Al_2O_3$ [μm] | (TiN + κ-$Al_2O_3$)$_x$ [μm] | κ-$Al_2O_3$ [μm] | Total [μm] |
|---|---|---|---|---|---|
| A (Invention) | 9.3 | 1.0 | 4.6 (x = 6) | — | 14.9 |
| B (Invention) | 3.5 | 0.9 | 2.8 (x = 6) | — | 7.2 |
| C (Reference) | 10.3 | 1.1 | 4.0 (x = 1) | — | 15.4 |
| D (Reference) | 9.6 | — | — | 4.8 | 14.4 |

CVD Deposition

A first innermost coating of about 0.4 μm TiN was deposited on all substrates in a process at 400 mbar and 885° C. A gas mixture of 48.8 vol % $H_2$, 48.8 vol % $N_2$ and 2.4 vol % $TiCl_4$ was used.

Thereafter an about 2 μm (Sample B) or about 8 μm (Sample A, C, D) thick MTCVD TiCN was deposited in two steps, an inner TiCN and an outer TiCN.

The inner TiCN was deposited for about 10 minutes at 55 mbar at 885° C. in a gas mixture of, 3.0 vol % $TiCl_4$, 0.45 vol % $CH_3CN$, 37.6 vol % $N_2$ and balance $H_2$.

The outer TiCN was deposited at 55 mbar at 885° C. in a gas mixture of 7.8 vol % $N_2$, 7.8 vol % HCl, 2.4 vol % $TiCl_4$, 0.65 vol % $CH_3CN$ and balance $H_2$.

On top of the MTCVD TiCN layer an approximately 1 μm thick bonding layer was deposited at 1000° C. by a process consisting of four separate reaction steps.

First a HTCVD TiCN was deposited at 400 mbar, using a gas mixture of 1.5 vol % $TiCl_4$, 3.4 vol % $CH_4$, 1.7% HCl, 25.5 vol % $N_2$ and 67.9 vol % $H_2$.

The three next steps were all deposited at 70 mbar. In the first (TiCNO-1) a gas mixture of 1.5 vol % $TiCl_4$, 0.40 vol % $CH_3CN$, 1.2 vol % CO, 1.2 vol % HCl, 12.0 vol % $N_2$ and balance $H_2$ was used. The next step (TiCNO-2) used a gas mixture of 3.1 vol % $TiCl_4$, 0.63 vol % $CH_3CN$, 4.6 vol % CO, 30.6 vol % $N_2$ and balance $H_2$. In the last bonding layer step (TiN) a gas mixture of 3.2 vol % $TiCl_4$, 32.3% vol % $N_2$ and 64.5 vol % $H_2$ was used.

Prior to the start of the subsequent $Al_2O_3$ nucleation, the bonding layer on sample A, B and C was oxidized for 4 minutes in a mixture of $CO_2$, CO, $N_2$ and $H_2$. On sample D no oxidation was performed.

On samples A, B and C, an approximately 1 μm α-$Al_2O_3$ layer was deposited on top of the bonding layer at 1000° C. and 55 mbar in two steps. The first step contained a gas mixture of 1.2 vol % $AlCl_3$, 4.7 vol % $CO_2$, 1.8 vol % HCl and balance $H_2$, and a second step contained a gas mixture of 1.2 vol % $AlCl_3$, 4.7 vol % $CO_2$, 2.9 vol % HCl, 0.58 vol % $H_2S$ and balance $H_2$.

On sample C, an approximately 0.1 μm TiN-layer was deposited on top of the α-$Al_2O_3$-layer at 1000° C. and 55 mbar in a gas mixture of of 57.5 vol % $H_2$, 41.1 vol % $N_2$ and 1.4 vol % $TiCl_4$. On top of this TiN-layer a κ-$Al_2O_3$ layer was deposited in two steps at 1000° C. and 55 mbar. The first step contained a gas mixture of 2.3 vol % $AlCl_3$, 4.6 vol % $CO_2$, 1.7 vol % HCl and balance $H_2$, and a second step contained a gas mixture of 2.2 vol % $AlCl_3$, 4.4 vol % $CO_2$, 5.5 vol % HCl, 0.33 vol % $H_2S$ and balance $H_2$. The first κ-$Al_2O_3$ process steps were performed for 10 minutes and the second step was adjusted to give a total κ-$Al_2O_3$ layer thickness of 4.0 μm.

On samples A and B, the three process steps above (TiN, first κ-$Al_2O_3$ process, second κ-$Al_2O_3$ process) were repeated 6 times forming a TiN/κ-$Al_2O_3$ multilayer. In both samples the same thickness for the TiN-sublayers were used as in sample C (approximately 0.1 μm). For the κ-$Al_2O_3$ multilayer, the same process time (10 minutes) as for sample C were used for the first κ-$Al_2O_3$ process step in the repeated steps. The process time for the second step was adjusted to give a total thickness of the TiN/κ-$Al_2O_3$ multilayer of 4.6 μm (sample A) and 2.8 μm (sample B), respectively.

On sample D, an 4.8 μm κ-$Al_2O_3$ was deposited directly on the bonding layer. The κ-$Al_2O_3$ was deposited in two process steps using the same gas mixtures as described for samples A, B and C. The first step was performed for 10 minutes and the second adjusted to give the total κ-$Al_2O_3$ thickness of 4.8 μm.

XRD Analyze

In order to investigate the texture of the κ-$Al_2O_3$-multilayer X-ray diffraction (XRD) was conducted on the flank face using a PANalytical CubiX$^3$ diffractometer equipped with a PIXcel detector. The coated cutting tools were mounted in sample holders to ensure that the flank face of the samples were parallel to the reference surface of the sample holder and also that the flank face was at appropriate height. Cu-Kα radiation was used for the measurements, with a voltage of 45 kV and a current of 40 mA. Anti-scatter slit of ½ degree and divergence slit of ¼ degree were used. The diffracted intensity from the coated cutting tool was measured in the range 15° to 140° 2θ, i.e. over an incident angle θ range from 7.5 to 70°.

Figure 3:
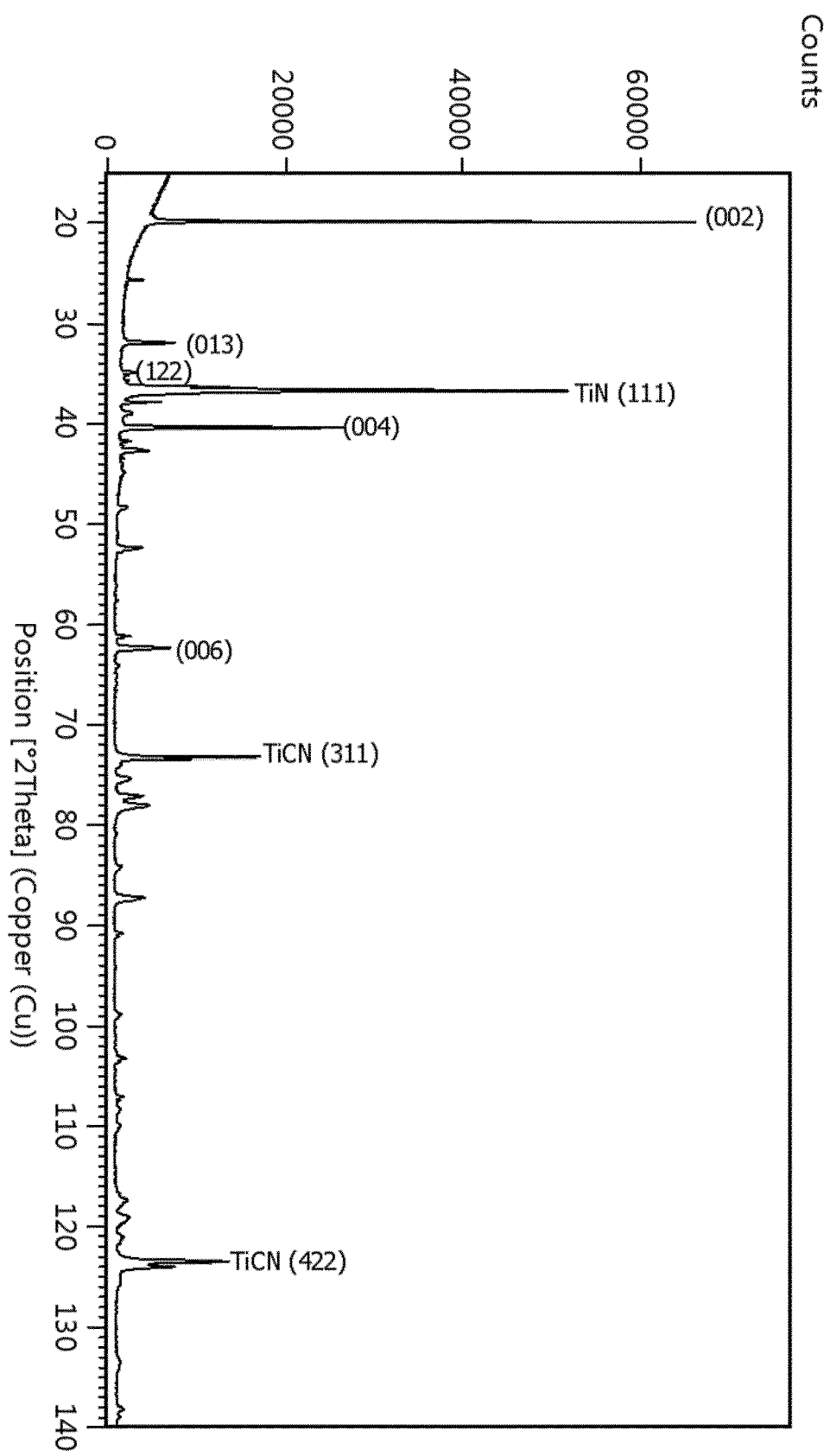
FIG. 3 shows an θ-2θ XRD diffractogram from Sample A. No corrections applied on the intensities.
Figure 4:
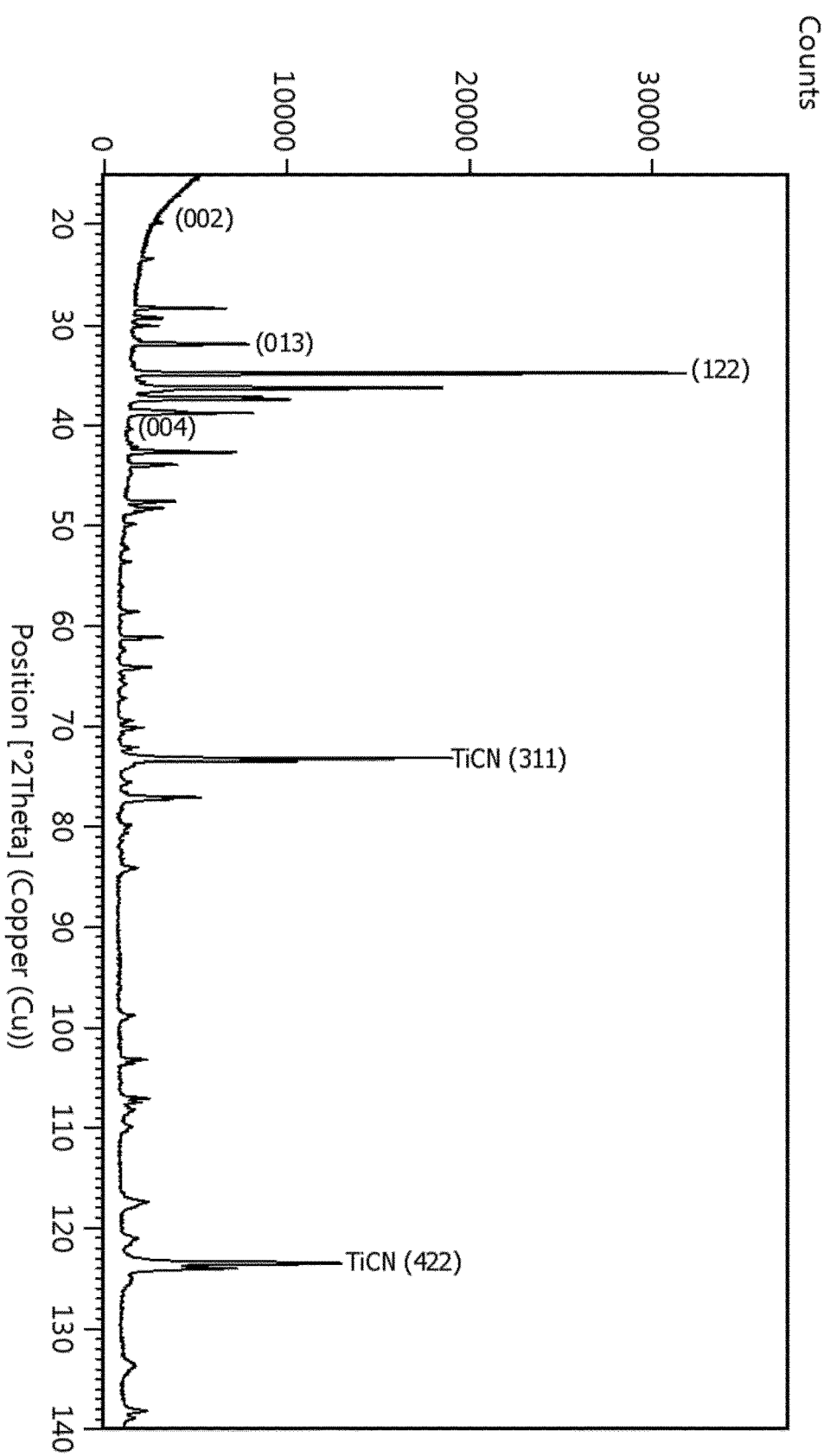
FIG. 4 shows an θ-2θ XRD diffractogram from Sample D. No corrections applied on the intensities.

The peak intensities in an XRD diffractogram were provided. Diffractograms (no applied correction) from Sample A and Sample D are shown in FIG. 3 and FIG. 4, respectively. In FIG. 3 the peaks originating from the {0 0 1} planes show a strong intensity at 2θ=19.85°, 40.33° and 62.24° for (0 0 2), (0 0 4) and (0 0 6) planes respectively. Compared to ICDD's PDF card No. 00-052-0803 these peaks are supposed to have 11%, 8% and 7% intensity for the (0 0 2), (0 0 4) and (0 0 6) planes respectively. The strongest peak according to PDF card 00-052-0803 is the (1 1 2) which is hardly observable in FIG. 3. The second strongest peak in PDF card 00-052-0803 is the (0 1 3) which can be observed as a weak peak in FIG. 3. The κ-Al$_2$O$_3$-multilayer of Sample A show a strong texture with {0 0 1} planes in parallel with the surface. In FIG. 4 the reflections from the (1 1 2) plane and the (0 1 3) are clearly visible. The 2θ values of the κ-Al$_2$O$_3$ peaks that were used to determine the texture of the κ-Al$_2$O$_3$ sublayers of the samples and the intensities of these peaks are listed in Table 2.

TABLE 2

Peak intensities (peak area) from the κ-Al$_2$O$_3$ XRD diffractogram, normalized such that the strongest κ-Al$_2$O$_3$ peak is set to 100.0 in intensity.

| Peak (h k l) | 2θ (°) | Sample A | Sample B | Sample C | Sample D |
|---|---|---|---|---|---|
| (0 0 2) | 19.85° | 100.0 | 100.0 | 100.0 | 1.4 |
| (0 1 3) | 31.89° | 17.0 | 71.9 | 10.4 | 19.5 |
| (1 2 2) | 34.81° | 5.3 | 22.7 | 1.8 | 100.0 |
| (0 0 4) | 40.34° | 64.0 | 60.4 | 65.0 | 1.0 |
| (0 0 6) | 62.30° | 26.1 | 25.0 | 24.7 | 0.5 |

The textures of the TiCN and the α-Al$_2$O$_3$ layers were also investigated. Texture coefficients TC(hkl) was measured by X-ray diffraction using CuKα radiation and θ-2θ scan. Harris formula $$TC(hkl) = \frac{I(hkl)}{I_0(hkl)} \left[\frac{1}{n}\sum_{n=1}^{n}\frac{I(hkl)}{I_0(hkl)}\right]^{-1}$$

was used in the calculation where I(hkl) is the measured intensity (peak area) of the (hkl) reflection, I$_0$(hkl) is the standard intensity, n is the number of reflections used in the calculation, and (hkl) the reflections used. Thin film correction and corrections for absorption in the covering layers were corrected for in the texture analysis of the TiCN layer and the α-Al$_2$O$_3$ layer. The corrections due to absorptions in the multilayer was generalized by summarizing the thicknesses of the 6 sublayers of TiN and the 6 sublayers of κ-Al$_2$O$_3$ and calculate as if only one TiN layer and one κ-Al$_2$O$_3$ layer was covering the layer of investigation.

For the TiCN layer the ICDD's PDF-card No. 42-1489 was used, the number of reflections was 7 and the (hkl) reflections used are (1 1 1), (2 0 0), (2 2 0), (3 1 1), (3 3 1), (4 2 0) and (4 2 2). Thin film correction was applied for the TiCN layer and the data was corrected for absorptions in the layers above, i.e. the α-Al$_2$O$_3$ layer, the κ-Al$_2$O$_3$ sublayers and the TiN sublayers. The results are shown in Table 3.

For the α-Al$_2$O$_3$ layer the ICDD's PDF-card No. 00-010-0173 was used, the number of reflections was 8 and the (hkl) reflections used are (1 0 4), (1 1 0), (1 1 3), (0 2 4), (1 1 6), (2 1 4), (3 0 0) and (0 0 12). Thin film correction was applied for the α-Al$_2$O$_3$ layer and the data was corrected for absorptions in the layers above, i.e. the κ-Al$_2$O$_3$ sublayers and the TiN sublayers. The results are shown in Table 4.

TABLE 3

Texture coefficients of TiCN.

| Sample | TC111 | TC200 | TC220 | TC311 | TC331 | TC420 | TC422 | TC311 + TC422 |
|---|---|---|---|---|---|---|---|---|
| A | 0.34 | 0.01 | 0.11 | 2.04 | 0.49 | 0.19 | 3.81 | 5.85 |
| B | 0.72 | 0.11 | 0.55 | 2.66 | 0.73 | 0.41 | 1.83 | 4.49 |
| C | 0.29 | 0.00 | 0.06 | 1.92 | 0.30 | 0.11 | 4.33 | 6.25 |
| D | 0.81 | 0.02 | 0.12 | 1.99 | 0.59 | 0.28 | 3.20 | 5.19 |

TABLE 4

Texture coefficients of α-Al$_2$O$_3$.

| Sample | TC104 | TC110 | TC113 | TC024 | TC116 | TC214 | TC300 | TC0012 |
|---|---|---|---|---|---|---|---|---|
| A | 0.08 | 0.82 | 0.04 | 0.23 | 0.04 | 0.04 | 0.00 | 6.74 |
| B | 0.36 | 0.52 | 0.14 | 0.36 | 0.37 | 0.13 | 0.05 | 6.07 |
| C | 0.03 | 1.23 | 0.02 | 0.19 | 0.04 | 0.08 | 0.00 | 6.42 |

Wear Test

The crater wear resistance of the coated cutting inserts of ISO-type CNMG120408 were evaluated in longitudinal turning in ball bearing steel (Ovako 825B) using the following cutting data:

Cutting speed, $v_c$: 220 m/min
Cutting feed, f: 0.3 mm/rev
Depth of cut, $a_p$: 2 mm
Water miscible metal working fluid was used for cooling.

Each insert was tested in 2 minutes intervals wherein the crater wear was measured at every break. The life time of the insert was considered reached when the substrate below the coating was first exposed. The life times of the two tests are shown in Table 5.

TABLE 5

Wear results

| Sample | Life time - Test 1 [minutes] | Life time - Test 2 [minutes] |
|---|---|---|
| A (Invention) | 38 | >44 |
| C (Reference) | 24 | 28 |
| D (Reference) | 16 | 16 |

For the Sample A in Test 2 the test was ended after 44 minutes even though no substrate was exposed so the life time is indicated as >44 minutes.

From the cutting tests it can be concluded that the 00l oriented Sample A and Sample C shows a higher crater wear resistance in longitudinal turning in ball bearing steel than the Sample D. The 1 μm $\alpha$-$Al_2O_3$ layer in the coatings of Sample A and Sample C cannot alone explain the large differences in wear resistance as compared to sample D. A high 00l orientation of the κ-$Al_2O_3$ is thus considered advantageous. The Sample A performed better than the Sample C and the difference between these coatings are that the Sample A has a κ-$Al_2O_3$ multilayer while the Sample C has the single κ-$Al_2O_3$ layer. Sample A with the well oriented 00l-κ-$Al_2O_3$ multilayer is thus the best performing sample in the tests.

While the invention has been described in connection with various exemplary embodiments, it is to be understood that the invention is not to be limited to the disclosed exemplary embodiments, on the contrary, it is intended to cover various modifications and equivalent arrangements within the appended claims.

Furthermore, it should be recognized that any disclosed form or embodiment of the invention may be incorporated in any other disclosed or described or suggested form or embodiment as a general matter of design choice. It is the intention, therefore, to be limited only as indicated by the scope of the appended claims appended hereto.

The invention claimed is:

1. A coated cutting tool comprising:
   a substrate; and
   a coating, wherein the coating comprises a multilayer consisting of alternating sublayers of κ-$Al_2O_3$ and sublayers of TiN, TiC, TiCN, TiCO or TiCNO, said multilayer including at least 3 sublayers of κ-$Al_2O_3$, wherein said multilayer exhibits an XRD diffraction over a θ-2θ scan of 15°-140°, wherein the 0 0 2 diffraction peak is a strongest peak originating from the κ-$Al_2O_3$ sublayers of the multilayer.

2. The coated cutting tool of claim 1, wherein an average thickness of each TiN, TiC, TiCN, TiCO or TiCNO sublayer is 10-500 nm.

3. The coated cutting tool of claim 1, wherein an average thickness of each κ-$Al_2O_3$ sublayer is 30-900 nm.

4. The coated cutting tool of claim 1, further comprising an $\alpha$-$Al_2O_3$-layer located between the substrate and the multilayer.

5. The coated cutting tool of claim 4, wherein a thickness of said $\alpha$-$Al_2O_3$-layer is 0.1-10 μm.

6. The coated cutting tool of claim 1, further comprising a TiCN layer located between the substrate and the multilayer.

7. The coated cutting tool of claim 6, wherein a thickness of said TiCN layer is 2-15 μm.

8. The coated cutting tool of claim 6, wherein the TiCN layer exhibits a texture coefficient TC(hkl), as measured by X-ray diffraction using CuKα radiation and θ-2θ scan, defined according to Harris formula, where I(hkl) is the measured intensity (peak area) of the (hkl) reflection, $I_0$(hkl) is the standard intensity according to ICDD's PDF-card No. 42-1489, n is the number of reflections, reflections used in the calculation are (1 1 1), (2 0 0), (2 2 0), (3 1 1), (3 3 1), (4 2 0) and (4 2 2), wherein the TC (422)+TC(311)>3.

9. The coated cutting tool of claim 1, wherein a thickness of said κ-$Al_2O_3$-multilayer is 1-15 μm.

10. The coated cutting tool of claim 1, wherein a total coating thickness is 2-9 μm and said κ-$Al_2O_3$-multilayer includes 5-70 sublayers of κ-$Al_2O_3$.

11. The coated cutting tool of claim 1, wherein a total coating thickness is 7-25 μm and the κ-$Al_2O_3$-multilayer includes 5-150 sublayers of κ-$Al_2O_3$.

12. The coated cutting tool of claim 1, wherein the multilayer includes alternating sublayers of κ-$Al_2O_3$ and sublayers of TiN.

13. The coated cutting tool of 1, wherein the substrate is of cemented carbide or of cermet.

14. The coated cutting tool of claim 1, wherein the substrate is of cemented carbide with a composition comprising 4-12 wt % Co, 0.1-10 wt % cubic carbides, nitrides or carbonitrides of metals from groups IVb, Vb and VIb) of the periodic table, including Ti, Nb, Ta or combinations thereof, and a balance of WC.

* * * * *